US011635473B2

(12) United States Patent
Lee et al.

(10) Patent No.: US 11,635,473 B2
(45) Date of Patent: Apr. 25, 2023

(54) SECONDARY BATTERY FOR TESTING INTERNAL SHORT, METHOD AND APPARATUS FOR TESTING INTERNAL SHORT OF SECONDARY BATTERY USING THE SAME

(71) Applicant: LG CHEM, LTD., Seoul (KR)

(72) Inventors: Sol-Nip Lee, Daejeon (KR); Ju-Hyun Kang, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 313 days.

(21) Appl. No.: 16/962,302

(22) PCT Filed: Jun. 26, 2019

(86) PCT No.: PCT/KR2019/007732
§ 371 (c)(1),
(2) Date: Jul. 15, 2020

(87) PCT Pub. No.: WO2020/027441
PCT Pub. Date: Feb. 6, 2020

(65) Prior Publication Data
US 2020/0341074 A1  Oct. 29, 2020

(30) Foreign Application Priority Data
Aug. 1, 2018 (KR) .......................... 10-2018-0089876

(51) Int. Cl.
*G01R 31/52* (2020.01)
*H01M 10/42* (2006.01)
(Continued)

(52) U.S. Cl.
CPC .......... *G01R 31/52* (2020.01); *G01R 31/385* (2019.01); *H01M 10/4285* (2013.01);
(Continued)

(58) Field of Classification Search
CPC .... G01R 31/52; G01R 31/385; G01R 31/396; G01R 31/392; H01M 50/531;
(Continued)

(56) References Cited

U.S. PATENT DOCUMENTS

2008/0143337 A1  6/2008  Fujikawa et al.
2008/0187826 A1  8/2008  Kasamatsu et al.
(Continued)

FOREIGN PATENT DOCUMENTS

CN    105633489 A    6/2016
EP    2157653 A1     2/2010
(Continued)

OTHER PUBLICATIONS

International Search Report (with partial translation) and Written Opinion issued in corresponding International Patent Application No. PCT/KR2019/007732, dated Oct. 23, 2019.
(Continued)

*Primary Examiner* — Lee E Rodak
*Assistant Examiner* — Trung Q Nguyen
(74) *Attorney, Agent, or Firm* — Morgan, Lewis & Bockius LLP

(57) ABSTRACT

Provided is a secondary battery for testing an internal short, and a method and apparatus for testing an internal short of a secondary battery using the same. The secondary battery for testing an internal short according to the present disclosure includes a positive electrode side metal terminal having one end disposed between a positive electrode plate and a separator of the secondary battery, and a negative electrode side metal terminal having one end disposed between a negative electrode plate and the separator of the secondary battery, and is used to cause an internal short by contact (Continued)

between the other end of the positive electrode side metal terminal and the other end of the negative electrode side metal terminal.

15 Claims, 20 Drawing Sheets

(51) Int. Cl.
  *G01R 31/385*  (2019.01)
  *H01M 50/531*  (2021.01)
  *H01M 50/105*  (2021.01)
  *H01M 50/553*  (2021.01)
  *H01M 50/562*  (2021.01)
  *H01M 50/548*  (2021.01)
  *H01M 50/55*  (2021.01)

(52) U.S. Cl.
  CPC ....... *H01M 50/105* (2021.01); *H01M 50/531* (2021.01); *H01M 50/553* (2021.01); *H01M 50/562* (2021.01); *H01M 50/548* (2021.01); *H01M 50/55* (2021.01)

(58) Field of Classification Search
  CPC ............. H01M 10/4285; H01M 50/55; H01M 50/548; H01M 10/4228
  USPC .......... 324/400, 430, 433, 500, 600, 764.01, 324/103 R, 771, 761.01, 501, 639, 642, 324/702, 76.11, 76.66, 96
  See application file for complete search history.

(56) References Cited

U.S. PATENT DOCUMENTS

| | | |
|---|---|---|
| 2010/0143789 A1 | 6/2010 | Kim |
| 2013/0209841 A1 | 8/2013 | Keyser et al. |
| 2018/0123166 A1 | 5/2018 | Fakhri et al. |
| 2018/0191179 A1* | 7/2018 | Yi ..................... H02J 7/0031 |
| 2018/0196107 A1 | 7/2018 | Fleischer et al. |
| 2019/0094309 A1 | 3/2019 | Cho et al. |
| 2019/0162771 A1* | 5/2019 | Miyazawa ......... G01R 31/3865 |

FOREIGN PATENT DOCUMENTS

| | | |
|---|---|---|
| JP | 2004-063133 A | 2/2004 |
| JP | 4822776 B2 | 11/2011 |
| JP | 5243838 B2 | 7/2013 |
| JP | 6033207 B2 | 11/2016 |
| JP | 2017-040633 A | 2/2017 |
| JP | 2018-136150 A | 8/2018 |
| JP | 2018-137141 A | 8/2018 |
| JP | 2020-528644 A | 9/2020 |
| KR | 10-0225584 B1 | 10/1999 |
| KR | 10-2009-0071664 A | 7/2009 |
| KR | 10-0962819 B1 | 6/2010 |
| KR | 10-2016-0009283 A | 1/2016 |
| KR | 10-1761971 B1 | 7/2017 |
| KR | 10-2018-0018050 A | 2/2018 |
| KR | 10-2018-0028467 A | 3/2018 |
| WO | 2018/084675 A1 | 5/2018 |

OTHER PUBLICATIONS

Espec, "Products for Secondary Battery Market" (2013), Retrieved from the Internet:URL:https://hielkematest.nl/wp-content/uploads/2017/02/Battery-Chambers.pdf [retrieved on Jun. 15, 2021].

Extended European Search Report issued from the European Patent Office dated Jun. 23, 2021 in the corresponding European Patent Application No. 19843283.3.

* cited by examiner (a)             (b)

സECONDARY BATTERY FOR TESTING INTERNAL SHORT, METHOD AND APPARATUS FOR TESTING INTERNAL SHORT OF SECONDARY BATTERY USING THE SAME

TECHNICAL FIELD

The present disclosure relates to a method and apparatus for evaluating safety of a secondary battery, and more particularly, to a method and apparatus for testing an internal short of a secondary battery.

The present application claims the benefit of Korean Patent Application No. 10-2018-0089876 filed on Aug. 1, 2018 with the Korean Intellectual Property Office, the disclosure of which is incorporated herein by reference in its entirety.

BACKGROUND ART

With the technology development and increasing demand for mobile devices, electric vehicles, energy storage systems and uninterruptible power systems, the demand for secondary batteries are dramatically increasing as an energy source that meets the demand for high output and high capacity.

A typical secondary battery is the lithium secondary batteries. A secondary battery includes a positive electrode plate and a negative electrode plate with a separator interposed therebetween. The separator is prone to shrink. By this reason, when the secondary battery is kept in an extremely high temperature environment for a long time, a mechanical contact between the positive electrode plate and the negative electrode plate occurs, causing an internal short. Additionally, the corresponding separator is destructed by conductive powder attached to the surface of the positive electrode plate or the negative electrode plate or lithium metal plated on the negative electrode plate, and the positive electrode plate and the negative electrode plate are electrically connected to each other, causing an internal short. Additionally, an internal short may occur due to external impacts applied to the secondary battery.

When an internal short occurs, the shorted part is expanded by Joule heat involved in the short circuit current and abnormal heat generation occurs, and in some cases, the secondary battery may be destroyed. As described above, when an internal short occurs, high electrical energy stored in each electrode plate flows instantaneously, and thus an explosion risk is much higher than accidents such as overcharge or overdischarge. By this reason, it is necessary to carefully manage an internal short for the purpose of safety, and it is important to prevent an internal short from occurring in the secondary battery, but when an internal short occurs in the secondary battery, suppressing the destruction and ensuring safety as described above is important. Accordingly, increasing the safety of the secondary battery in the event of an internal short and accurately evaluating whether a secondary battery is safe by performing an internal short test after secondary battery design or fabrication is regarded as being more important.

As the existing technique for causing an internal short, nail penetration and Internal Short Circuit (ISC) devices are known. The nail penetration causes a nail pass through a secondary battery to induce an internal short, and is the easiest way to cause an internal short. However, it is impossible to perfectly simulate the internal short issue occurring in the field, and an over internal short above necessary occurs. ISC devices were developed by researchers of National Renewable Energy Laboratory (NREL), Department Of Energy (DOE), USA, and relevant patent is US2013-0209841.

FIG. 1 is an exploded perspective view of an ISC device, and FIG. 2 is a cross-sectional view showing a method of inserting the ISC device into a secondary battery.

Referring to FIG. 1, the ISC device 1 includes a copper disk 10 and an aluminum disk 40 with a wax layer 30 interposed therebetween, and a polyethylene or polypropylene membrane 20 is interposed between the copper disk 10 and the wax layer 30 and has a copper puck 15 at the center. As shown in FIG. 2, the ISC device 1 is inserted and used between the positive electrode plate 110 and the negative electrode plate 120 of the secondary battery. First, a hole H is formed in the separator 130 between the positive electrode plate 110 and the negative electrode plate 120 of the secondary battery, and the ISC device 1 is inserted into the hole H of the separator 130 in the arrow direction such that the copper disk 10 of the ISC device 1 comes into contact with the negative electrode plate 120 and the aluminum disk 40 of the ISC device 1 comes into contact with the positive electrode plate 110. When the secondary battery having the ISC device 1 inserted between the positive electrode plate 110 and the negative electrode plate 120 is exposed to high temperature, the wax layer 30 of the ISC device 1 melts, and the copper disk 10 and the aluminum disk 40 of the ISC device 1 are electrically connected to each other, causing an internal short of the secondary battery.

However, the ISC device 1 only operates above a specific temperature at which the wax layer 30 melts, and it is impossible to cause an internal short at room temperature. Additionally, because the wax layer 30 generally melts at high temperature (60° C. or above), the process of manufacturing a pouch type secondary battery including the lamination process involving high temperature heat is impossible to insert the ISC device 1 from the beginning when manufacturing the secondary battery, and after disassembling the manufactured secondary battery, the ISC device 1 is inserted. Additionally, when testing the secondary battery subjected to an internal short after long cycle or high temperature aging, the wax layer 30 melts before the test, making the intended test impossible.

DISCLOSURE

Technical Problem

The present disclosure is designed to solve the above-described problem, and therefore the present disclosure is directed to providing a secondary battery for testing an internal short, in which an internal short test is performed in a desired state of the secondary battery after long cycle and high temperature storage without being affected by the testing temperature condition.

The present disclosure is further directed to providing a method and apparatus for testing an internal short of a secondary battery, in which an internal short test is performed in a desired state of the secondary battery after long cycle and high temperature storage without being affected by the testing temperature condition.

These and other objects and advantages of the present disclosure will be understood by the following description and will be apparent from the embodiments of the present disclosure. Further, it will be readily understood that the objects and advantages of the present disclosure are realized by the means set forth in the appended claims and combinations thereof.

Technical Solution

To achieve the above-described object, a secondary battery for testing an internal short according to the present disclosure includes at least one unit cell including a positive electrode plate including a positive electrode current collector and a positive electrode active material layer, a negative electrode plate including a negative electrode current collector and a negative electrode active material layer, and a separator interposed between the positive electrode plate and the negative electrode plate, wherein any one of the at least one unit cell includes, a positive electrode side metal terminal having one end disposed between the positive electrode plate and the separator and the other end extending out of the unit cell, and a negative electrode side metal terminal having one end disposed between the negative electrode plate and the separator and the other end extending out of the unit cell, and wherein the secondary battery for testing an internal short is used to cause an internal short in the unit cell by contact between the other end of the positive electrode side metal terminal and the other end of the negative electrode side metal terminal.

In a preferred embodiment, the secondary battery for testing an internal short further includes a positive electrode tab formed in the positive electrode plate and a positive electrode lead having one end connected to the positive electrode tab, a negative electrode tab formed in the negative electrode plate and a negative electrode lead having one end connected to the negative electrode tab, and a pouch type battery case which is sealed with the unit cell and an electrolyte solution received therein, and wherein the other end of the positive electrode lead, the negative electrode lead, the positive electrode side metal terminal and the negative electrode side metal terminal is exposed from the battery case.

In this instance, the positive electrode side metal terminal and the negative electrode side metal terminal may be formed distinguishably with an eye, or the positive electrode side metal terminal, the negative electrode side metal terminal, the positive electrode lead and the negative electrode lead may be formed distinguishably with an eye.

The positive electrode side metal terminal may be at least one of a positive electrode side first metal terminal having one end disposed in the positive electrode current collector and a positive electrode side second metal terminal having one end disposed in the positive electrode active material layer, and the negative electrode side metal terminal may be at least one of a negative electrode side first metal terminal having one end disposed in the negative electrode current collector and a negative electrode side second metal terminal having one end disposed in the negative electrode active material layer.

In an example, the secondary battery for testing an internal short may include a plurality of unit cells, and only one of the unit cells may include the positive electrode side metal terminal and the negative electrode side metal terminal.

In another example, the secondary battery for testing an internal short may include a plurality of unit cells, and one of the unit cells may include any one of the positive electrode side first metal terminal and the positive electrode side second metal terminal and any one of the negative electrode side first metal terminal and the negative electrode side second metal terminal, and other unit cell may include the other one of the positive electrode side first metal terminal and the positive electrode side second metal terminal and the other one of the negative electrode side first metal terminal and the negative electrode side second metal terminal.

Preferably, one end of the positive electrode side metal terminal and the negative electrode side metal terminal is aligned at a same location in a vertical direction inside of the unit cell, and the other end of the positive electrode side metal terminal and the negative electrode side metal terminal is spaced apart in a horizontal direction outside of the unit cell.

To this end, the positive electrode side metal terminal and the negative electrode side metal terminal may be bent on a plane.

To achieve another object, a method for testing an internal short of a secondary battery according to the present disclosure, in which the secondary battery includes at least one unit cell, the unit cell including a positive electrode plate including a positive electrode current collector and a positive electrode active material layer, a negative electrode plate including a negative electrode current collector and a negative electrode active material layer, and a separator interposed between the positive electrode plate and the negative electrode plate, the method includes (a) in any one unit cell, forming a positive electrode side metal terminal having one end disposed between the positive electrode plate and the separator and the other end extending out of the unit cell, (b) in the unit cell having the positive electrode side metal terminal, forming a negative electrode side metal terminal having one end disposed between the negative electrode plate and the separator and the other end extending out of the unit cell, and (c) causing an internal short in the unit cell by contact between the other end of the positive electrode side metal terminal and the other end of the negative electrode side metal terminal.

The step (c) may include connecting a short circuit including a switch and a resistor to the positive electrode side metal terminal and the negative electrode side metal terminal in an off state of the switch, and turning on the switch to cause an internal short in the unit cell, and measuring a current flowing in the short circuit.

Additionally, the secondary battery may further include a positive electrode tab formed in the positive electrode plate and a positive electrode lead having one end connected to the positive electrode tab, a negative electrode tab formed in the negative electrode plate and a negative electrode lead having one end connected to the negative electrode tab, and a pouch type battery case which is sealed with the unit cell and an electrolyte solution received therein, wherein the other end of the positive electrode lead, the negative electrode lead, the positive electrode side metal terminal and the negative electrode side metal terminal is exposed from the battery case, and the method may further include measuring voltage between the positive electrode lead and the negative electrode lead while causing the internal short in the step (c).

Moreover, according to the testing method, the step (c) may be performed while the secondary battery is charged by connecting a power source between the positive electrode lead and the negative electrode lead or while the secondary battery is discharged by connecting a load between the positive electrode lead and the negative electrode lead.

Particularly, the positive electrode side metal terminal may be at least one of a positive electrode side first metal terminal having one end disposed in the positive electrode current collector and a positive electrode side second metal terminal having one end disposed in the positive electrode active material layer, and the negative electrode side metal terminal may be at least one of a negative electrode side first metal terminal having one end disposed in the negative electrode current collector and a negative electrode side second metal terminal having one end disposed in the negative electrode active material layer.

The method for testing an internal short of a secondary battery according to the present disclosure may be easily performed using the secondary battery for testing an internal short according to the present disclosure.

The present disclosure further provides an apparatus for testing an internal short that is suitable for performing the method for testing an internal short according to the present disclosure. The apparatus includes an anti-explosion chamber which loads the secondary battery for testing an internal short according to the present disclosure, a short circuit configured to be connected to the positive electrode side metal terminal and the negative electrode side metal terminal of the secondary battery for testing an internal short, the short circuit comprising a switch and a resistor, a current measuring apparatus which measures a current flowing in the short circuit, and a controller which controls on-off of the switch.

The apparatus may further include a power source or a load configured to be connected between the positive electrode lead and the negative electrode lead of the secondary battery for testing an internal short, and a voltage measuring apparatus which measures voltage between the positive electrode lead and the negative electrode lead.

Advantageous Effects

The method for testing an internal short according to the present disclosure does not simulate an abnormal situation such as a nail penetration test. According to the present disclosure, it is possible to perfectly simulate the internal short issue occurring in the field, and cause an internal short under a condition in which an over internal short above necessary does not occur, and at that time, evaluate of safety of the secondary battery.

The method for testing an internal short according to the present disclosure can be used in the secondary battery design or examination after assembly. The state of the secondary battery is evaluated by accurately simulating the internal short situation of the secondary battery, achieving substantial safety evaluation of the secondary battery design, and can be used in the examination and correction of new design standards.

According to the present disclosure, one end of the positive electrode side metal terminal and one end of the negative electrode side metal terminal that may cause an internal short are disposed inside of the unit cell and the other end is disposed outside of the unit cell. By causing an internal short by contact between the other end of the positive electrode side metal terminal and the other end of the negative electrode side metal terminal, it is possible to control the accurate time point in which the short circuit occurs outside of the unit cell. By connecting the resistor to the other end of the metal terminal that may cause an internal short and measuring the current flowing across the resistor, it is possible to measure the short circuit current and the short circuit resistance according to each type of internal short.

According to the present disclosure, the wax layer used in the conventional ISC device is not used, and thus it is possible to avoid the influence of the testing temperature condition. Because it is not affected by the testing environment, it is possible to cause an internal short even at room temperature, and simulate the internal short in a desired cell state after long cycle and high temperature storage.

According to the present disclosure, the metal terminal having the other end disposed outside of the cell unit may cause an internal short of the secondary battery sustainably and controllably. One end of the metal terminal may be disposed at any location within the unit cell. Accordingly, four types of internal shorts may occur in the positive electrode current collector—the negative electrode current collector, the positive electrode active material layer—the negative electrode current collector, the positive electrode active material layer—the negative electrode active material layer, and the positive electrode current collector—the negative electrode active material layer of the secondary battery.

BRIEF DESCRIPTION OF DRAWINGS

The accompanying drawings illustrate preferred embodiments of the present disclosure and, together with the following detailed description, serve to provide a further understanding of the technical features of the present disclosure. However, the present disclosure is not to be construed as being limited to the drawings.

MODE FOR DISCLOSURE

Figure 1:
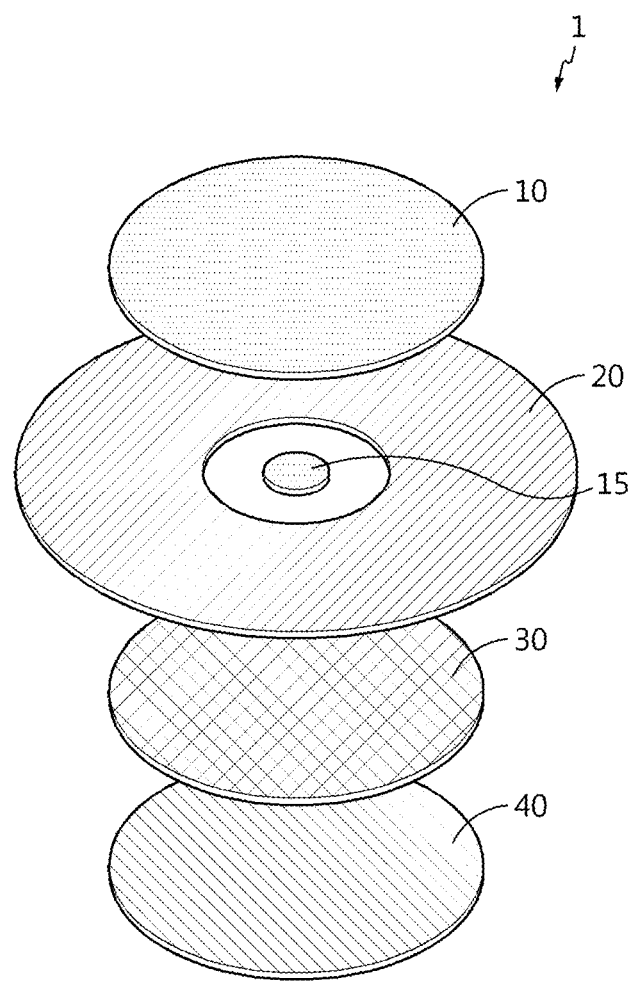
FIG. 1 is an exploded perspective view of the conventional ISC device.

Hereinafter, the preferred embodiments of the present disclosure will be described in detail with reference to the accompanying drawings. However, the embodiments according to the present disclosure may be modified in many different forms, and the scope of the present disclosure should not be interpreted as limited to the disclosed embodiments. The embodiments of the present disclosure are provided to help those skilled in the art to understand the present disclosure completely and fully.

It should be understood that the terms or words used in the specification and the appended claims should not be construed as limited to general and dictionary meanings, and should be interpreted based on the meanings and concepts corresponding to technical aspects of the present disclosure on the basis of the principle that the inventor is allowed to define terms appropriately for the best explanation.

Therefore, the embodiments described herein and illustrations shown in the drawings are just a most preferred embodiment of the present disclosure, but not intended to fully describe the technical aspects of the present disclosure, so it should be understood that other equivalents and modifications could be made thereto at the time of filing the application. In the drawings, like reference numerals denote like elements.

In the embodiments described below, a secondary battery refers to a lithium secondary battery. Here, the lithium secondary battery refers collectively to secondary batteries in which lithium ions act as working ions during charging and discharging, causing electrochemical reactions at the positive electrode and the negative electrode.

Meanwhile, it should be interpreted as that even though the name of the secondary battery changes depending on the type of electrolyte or separator used in the lithium secondary battery, the type of battery case used to package the secondary battery and the internal or external structure of the lithium secondary battery, the lithium secondary battery covers any secondary battery using lithium ions as working ions.

The present disclosure may be also applied to secondary batteries other than lithium secondary batteries. Accordingly, it should be interpreted that the present disclosure covers any type of secondary battery to which the technical aspects of the present disclosure may be applied, though working ions are not lithium ions.

Figure 3:
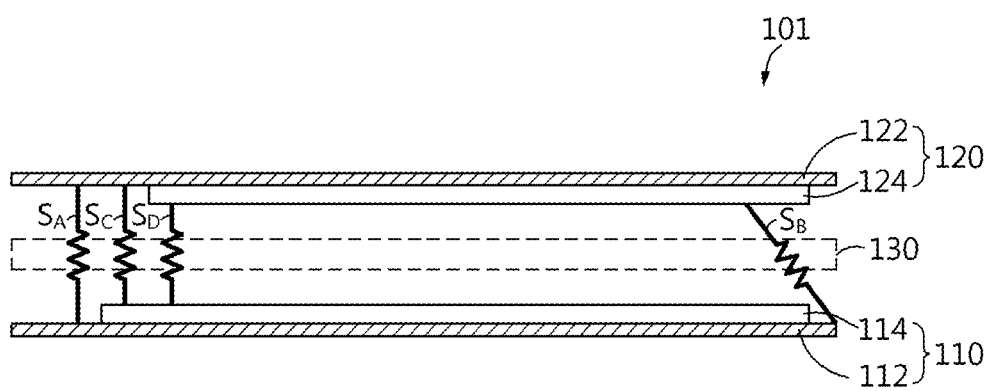
FIG. 3 is a diagram illustrating the internal structure of a unit cell and the type of internal short.

FIG. 3 is a diagram illustrating the internal structure of a unit cell and the type of internal short.

Referring to FIG. 3, the unit cell 101 includes a positive electrode plate 110, a negative electrode plate 120 and a separator 130.

The positive electrode plate 110 includes a positive electrode current collector 112 and a positive electrode active material layer 114, and the negative electrode plate 120 includes a negative electrode current collector 122 and a negative electrode active material layer 124. Although FIG. 3 shows the positive electrode active material layer 114 formed on one surface of the positive electrode current collector 112 and the negative electrode active material layer 124 formed on one surface of the negative electrode current collector 122, the positive electrode active material layer 114 may be formed on two surfaces of the positive electrode current collector 112. The negative electrode active material layer 124 may be also formed on two surfaces of the negative electrode current collector 122.

The positive electrode plate 110 may be manufactured by coating the positive electrode active material layer 114 including lithium metal oxide NCM containing Ni, Co, Mn as a positive electrode active material on the positive electrode current collector 112 such as, for example, aluminum (Al), drying and pressing. The negative electrode plate 120 may be manufactured by coating the negative electrode active material layer 124 including graphite as a negative electrode active material on the negative electrode current collector 122 such as, for example, copper (Cu), followed by drying and pressing. The separator 130 is interposed between the positive electrode plate 110 and the negative electrode plate 120 to separate them. The separator 130 is a porous insulation film, to allow lithium ion movement and electrically separate each electrode plate 110, 120.

The separator 130 may include, for example, a sheet or a nonwoven fabric made from olefin-based polymer having chemical resistance and hydrophobic property such as polypropylene, glass fiber or polyethylene, but is not limited thereto. Preferably, inorganic particles may be coated on the surface of the separator 130.

There are four types of internal shorts in the unit cell 101. They are an internal short $S_A$ between the positive electrode current collector 112 and the negative electrode current collector 122, an internal short $S_B$ between the positive electrode current collector 112 and the negative electrode active material layer 124, an internal short $S_C$ between the positive electrode active material layer 114 and the negative electrode current collector 122, and an internal short $S_D$ between the positive electrode active material layer 114 and the negative electrode active material layer 124. A secondary battery for testing an internal short according to the present disclosure is configured to separately test each of the four types of internal shorts $S_A$~$S_D$.

Figure 4:
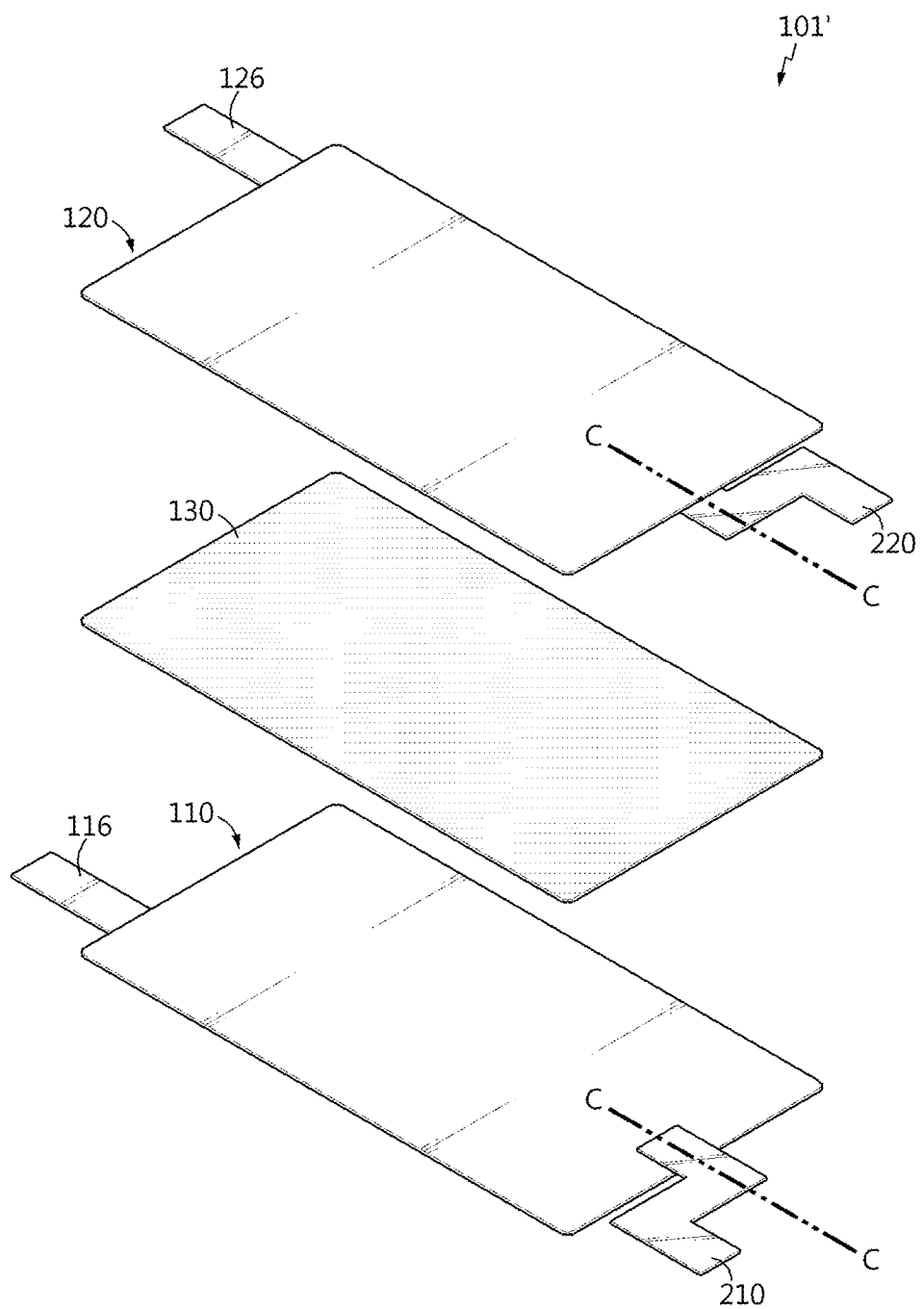
FIG. 4 is an exploded perspective view of a unit cell in a secondary battery for testing an internal short according to the present disclosure.
Figure 5:
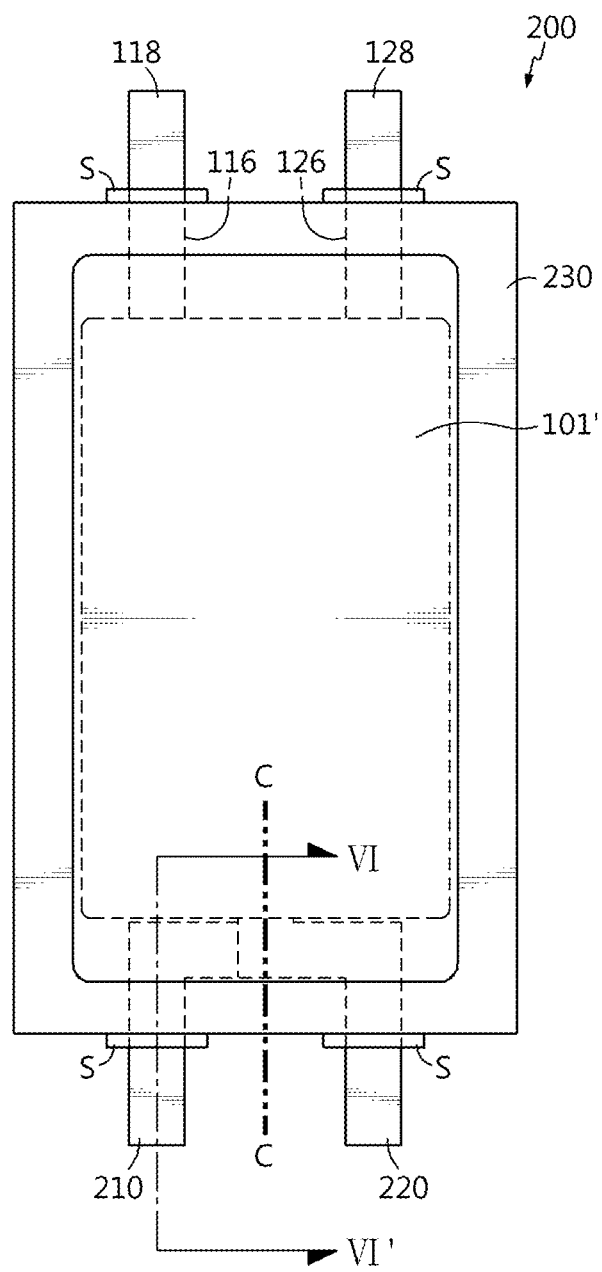
FIG. 5 is a top view of a sealed battery case having the unit cell of FIG. 4 received therein.
Figure 6:
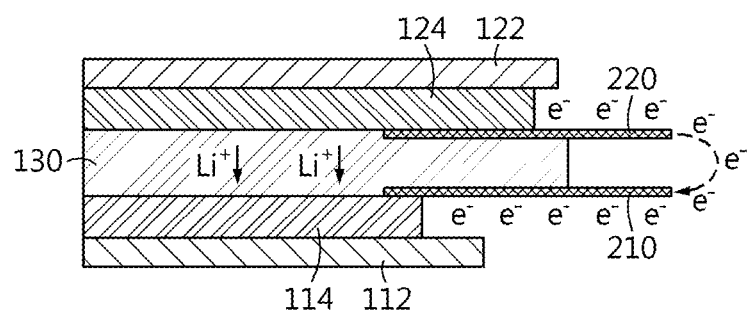
FIG. 6 is a cross-sectional view taken along the line VI-VI' of FIG. 5.

FIGS. 4 to 6 are diagrams of the secondary battery for testing an internal short according to the present disclosure, FIG. 4 is an exploded perspective view of the unit cell included in the secondary battery for testing an internal short according to the present disclosure, and FIG. 5 is a top view of a sealed battery case having the unit cell of FIG. 4 received therein. FIG. 6 is a cross-sectional view taken along the line VI-VI' of FIG. 5 along the lengthwise direction of a metal terminal, and some elements are omitted and only a minimum of elements necessary for description are shown.

A secondary battery basically includes an electrode assembly including a unit cell including a positive electrode plate, a negative electrode plate and a separator interposed therebetween, for example, the unit cell 101 shown in FIG. 3. Although the embodiment described below with reference to FIGS. 4 to 6 shows the electrode assembly including one unit cell, the electrode assembly may include a plurality of unit cells, and preferably, at least one of the plurality of unit cells has the structure as described with reference to FIG. 3. The unit cell may be used to manufacture a stack, stack and fold, jelly roll type electrode assembly. The methods of manufacturing many types of electrode assemblies are well known in the art, and its detailed description is omitted herein.

Referring to FIGS. 4 to 6, the secondary battery 200 for testing an internal short according to the present disclosure may basically include a similar unit cell to that of FIG. 3. The secondary battery 200 for testing an internal short includes a unit cell 101' including a positive electrode plate 110, a negative electrode plate 120 and a separator 130.

The positive electrode plate 110 includes a positive electrode tab 116, and the negative electrode plate 120 includes a negative electrode tab 126. The positive electrode current collector 112 and the negative electrode current collector 122 include a region not coated with an active material layer (an uncoated region), and each electrode tab 116, 126 may be formed in the uncoated region. As shown, each electrode tab 116, 126 may protrude in one direction such that they are formed in parallel on one side of the unit cell 101', and may protrude in two directions such that they are formed on one side of the unit cell 101' and the other side opposite one side.

In the secondary battery 200 for testing an internal short, the unit cell 101' includes a positive electrode side metal terminal 210 and a negative electrode side metal terminal 220. In detail, in the unit cell 101', the positive electrode side metal terminal 210 has one end disposed between the positive electrode plate 110 and the separator 130 and the other end extending out of the unit cell 101'. The negative electrode side metal terminal 220 has one end disposed between the negative electrode plate 120 and the separator 130 and the other end extending out of the unit cell 101'.

Here, the positive electrode side metal terminal 210 may be formed between the positive electrode current collector of the positive electrode plate 110 and the separator 130 or between the positive electrode active material layer of the positive electrode plate 110 and the separator 130. Of course, the positive electrode side metal terminal may be formed between the positive electrode current collector of the positive electrode plate 110 and the separator 130 and the positive electrode side metal terminal may be formed between the positive electrode active material layer and the separator 130. Particularly, referring to FIG. 6, this embodiment describes the positive electrode side metal terminal 210 formed between the positive electrode active material layer 114 of the positive electrode plate 110 and the separator 130 as an example.

The negative electrode side metal terminal 220 may be formed between the negative electrode current collector of the negative electrode plate 120 and the separator 130 or between the negative electrode active material layer of the negative electrode plate 120 and the separator 130. Of course, the negative electrode side metal terminal may be formed between the negative electrode current collector of the negative electrode plate 120 and the separator 130 and the negative electrode side metal terminal may be formed between the negative electrode active material layer and the separator 130. As shown in FIG. 6, this embodiment describes the negative electrode side metal terminal 220 formed between the negative electrode active material layer 124 of the negative electrode plate 120 and the separator 130 as an example.

The positive electrode side metal terminal 210 and the negative electrode side metal terminal 220 are preferably formed at a location where there is no interference with each electrode tab 116, 126. One end of the positive electrode side metal terminal 210 and the negative electrode side metal terminal 220 may contact each electrode plate 110, 120, and the other end may be exposed from the unit cell 101'. One end of each metal terminal 210, 220 in contact with each electrode plate 110, 120 is preferably aligned in the vertical or horizontal direction with respect to the wide surface of the unit cell 101'. Accordingly, as shown in FIGS. 4 and 5, when the line where the plane perpendicular to the plane on which the wide surface of the unit cell 101' is placed meets each electrode plate 110, 120 is indicated by, for example, C—C, it is desirable to insert each metal terminal 210, 220 such that one end of each metal terminal 210, 220 is placed on C—C, and when viewed down from the wide surface of the unit cell 101', one end of each metal terminal 210, 220 is aligned at the same location. When alignment fails, each electrode plate 110, 120 in contact with each metal terminal 210, 220 acts as a non-reactive area, and there is a likelihood of capacity reduction and Li-plating. Accordingly, preferably, one end of the positive electrode side metal terminal 210 and the negative electrode side metal terminal 220 is placed along C—C and aligned at the same location in the vertical or horizontal direction within the unit cell 101'.

Additionally, to prevent an unintentional short caused by contact between each metal terminal 210, 220, except the other end that will contact to cause an internal short, parts of each metal terminal 210, 220 not in direct contact with each electrode plate 110, 120 are preferably insulated. For example, an insulation tape may be attached to the corresponding part.

Meanwhile, when handling in other cases except the internal short test, to avoid an unintentional contact between each metal terminal 210, 220 caused by horizontal or vertical external mechanical factors, the positive electrode side metal terminal 210 and the negative electrode side metal terminal 220 are preferably spaced apart from each other on the plane on which the wide surface of the unit cell 101' is placed. That is to say, preferably, the other end of the positive electrode side metal terminal 210 and the other end of the negative electrode side metal terminal 220 are spaced apart from each other outside of the unit cell 101'. It is to prevent an inadvertent contact between them before the internal short test.

Accordingly, in this embodiment, each metal terminal 210, 220 may be bent in a predetermined shape such that they are aligned at the same location in the vertical direction inside of the unit cell 101' and spaced apart from each other in the horizontal direction outside of the unit cell 101' as shown. The flat shape of each metal terminal 210, 220 may be folded twice by 90°, and each metal terminal 210, 220 of a strip shape may be folded twice by 90°. In any case, the positive electrode side metal terminal 210 and the negative electrode side metal terminal 220 may be bent on the plane. Although this embodiment describes each electrode tab 116, 126 formed in parallel on one side of the unit cell 101' and the positive electrode side metal terminal 210 and the negative electrode side metal terminal 220 formed in parallel on the other side, the present disclosure is not limited to this formation location.

The secondary battery 200 for testing an internal short includes a positive electrode lead 118 having one end connected to the positive electrode tab 116 and a negative electrode lead 128 having one end connected to the negative electrode tab 126, and an appropriate battery case, for example, the pouch type battery case 230 shown in FIG. 5, in which the unit cell 101' and an electrolyte solution are received, and the battery case is sealed by heat-sealing. The other end of each of the positive electrode lead 118, the negative electrode lead 128, the positive electrode side metal terminal 210, and the negative electrode side metal terminal 220 is exposed from the battery case 230. To increase sealability, a sealing tape S may be interposed between the positive electrode lead 118, the negative electrode lead 128, the positive electrode side metal terminal 210 and the negative electrode side metal terminal 220, and the battery case 230. The positive electrode lead 118 having the attached sealing tape S is connected to the positive electrode tab 116, the negative electrode lead 128 having the attached sealing tape S is connected to the negative electrode tab 126, wherein for the positive electrode side metal terminal 210, a metal strip, for example aluminum, having the attached sealing tape S is used, and for the negative electrode side metal terminal 220, a metal strip, for example, copper, having the attached sealing tape S is used.

There is no need to attach or weld the positive electrode side metal terminal 210 and the negative electrode side metal terminal 220 to the unit cell 101'. Simply, one end of the positive electrode side metal terminal 210 and one end of the negative electrode side metal terminal 220, after being inserted into a desired location among the positive electrode plate 110, the separator 130 and the negative electrode plate 120, may be positioned in place by a general secondary battery manufacturing method, for example, lamination.

In addition to the unit cell 101', when the secondary battery 200 for testing an internal short further includes another unit cell, the positive electrode tabs are converged and connected to one positive electrode lead, and the negative electrode tabs are converged and connected to one negative electrode lead. Except this, the previous description applies.

The positive electrode side metal terminal 210 and the negative electrode side metal terminal 220 may be formed distinguishably with an eye. For example, the positive electrode side metal terminal 210 and the negative electrode side metal terminal 220 may be distinguishably formed in different colors, using markings, in different sizes (thickness or width), or different lengths exposed from the unit cell 101'. When aluminum is used for the positive electrode side metal terminal 210 and copper is used for the negative electrode side metal terminal 220, a color difference naturally occurs due to a material difference. To make a color difference, the other end of each metal terminal 210, 220 may be colored using means such as an ink (more preferably, electrically conductive). Each metal terminal 210, 220 may be marked using a marking means such as laser marking.

Additionally, when the positive electrode side metal terminal 210 and the negative electrode side metal terminal 220 are formed distinguishably with an eye, and moreover, they are formed distinguishably from the positive electrode lead 118 and the negative electrode lead 128, each metal terminal 210, 220 that is a terminal for the internal short test and each electrode lead 118, 128 that is a terminal actually related to the current input/output (I/O) of the secondary battery can be distinguished, and more preferably, there is no risk of misunderstanding or confusion when handling.

As shown in FIG. 6, in this embodiment, the positive electrode side metal terminal 210 is formed between the positive electrode active material layer 114 and the separator 130, and the negative electrode side metal terminal 220 is formed between the negative electrode active material layer 124 and the separator 130. When the secondary battery 200 for testing an internal short is used by the normal method in the same way as other secondary batteries, electrons ($e^-$) related with charge/discharge will move through an external wire (not shown) connected to the positive electrode lead 118 and the negative electrode lead 128 and lithium ions ($Li^+$) will move between the positive electrode plate 110 and the negative electrode plate 120 (for example, in the arrow direction) through the separator 130 by the working principle of secondary battery.

Referring further to FIG. 6, the principle of an internal short by the metal terminals 210, 220 is described. In the internal short testing step, when a contact is made between the other end of the positive electrode side metal terminal 210 and the other end of the negative electrode side metal terminal 220, a direct electron ($e^-$) movement channel is formed between the positive electrode side metal terminal 210 and the negative electrode side metal terminal 220 as indicated by the dotted arrow, and as a result, an internal short situation of the unit cell 101' is simulated. Particularly, this case simulates the internal short $S_D$ (see FIG. 3) between the positive electrode active material layer 114 and the negative electrode active material layer 124.

FIGS. 7A to 7D are cross-sectional views along the lengthwise direction of the metal terminal in the same way as FIG. 6, showing implementation according to the type of internal short.

Figure 7A:
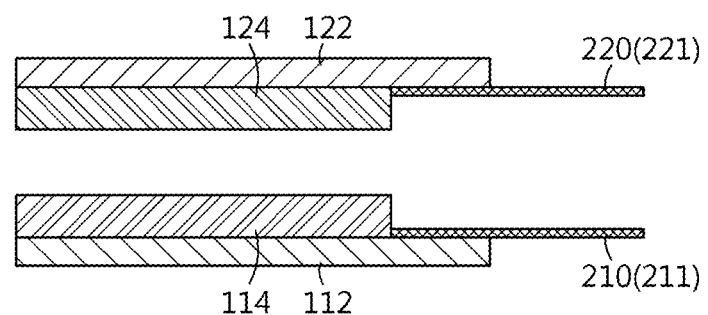
FIGS. 7A to 7D are cross-sectional views along the lengthwise direction of the metal terminal showing implementation according to each type of internal short.
Figure 7B:
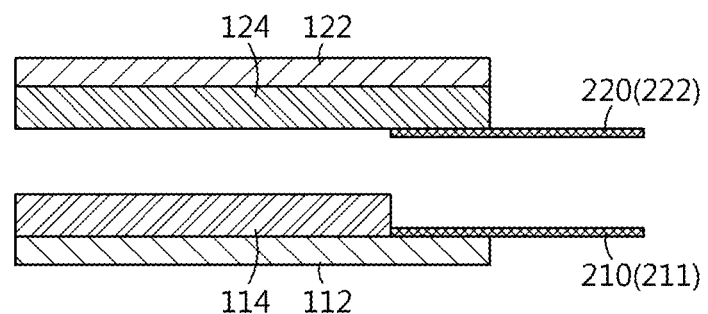
Figure 7C:
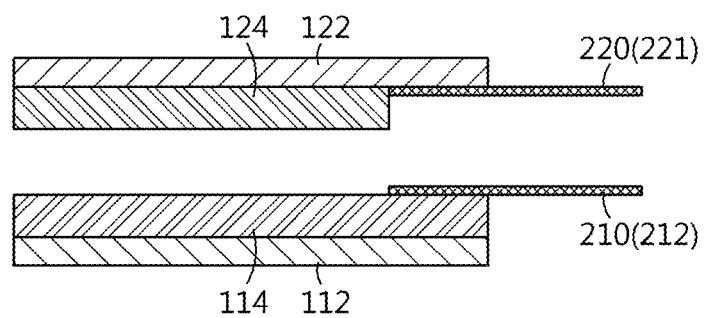
Figure 7D:
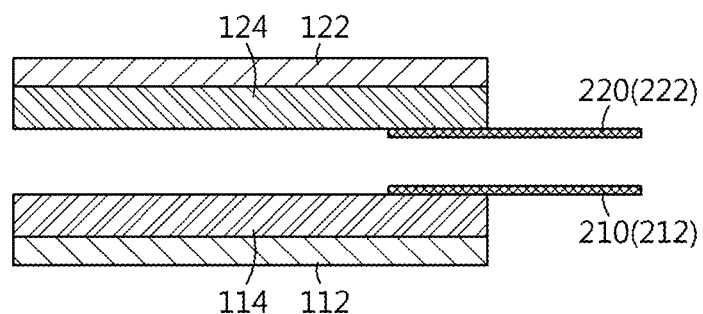

FIG. 7A shows a unit cell including the positive electrode side metal terminal 210 and the negative electrode side metal terminal 220 to simulate the internal short $S_A$ between the positive electrode current collector 112 and the negative electrode current collector 122, FIG. 7B shows a unit cell for the internal short $S_B$ between the positive electrode current collector 112 and the negative electrode active material layer 124, FIG. 7C shows a unit cell for the internal short $S_C$ between the positive electrode active material layer 114 and the negative electrode current collector 122, and FIG. 7D shows a unit cell for the internal short $S_D$ between the positive electrode active material layer 114 and the negative electrode active material layer 124 as described above in FIG. 6.

In FIGS. 7A and 7B, one end of the positive electrode side metal terminal 210 is disposed in the positive electrode current collector 112, and particularly, the positive electrode side metal terminal 210 positioned at this location is referred to as a positive electrode side first metal terminal 211. In FIGS. 7C and 7D, one end of the positive electrode side metal terminal 210 is disposed in the positive electrode active material layer 114, and particularly, the positive electrode side metal terminal 210 positioned at this location is referred to as a positive electrode side second metal terminal 212. In FIGS. 7A and 7C, one end of the negative electrode side metal terminal 220 is disposed in the negative electrode current collector 122, and particularly, the negative electrode side metal terminal 220 positioned at this location is referred to as a negative electrode side first metal terminal 221. In FIGS. 7B and 7D, one end of the negative electrode side metal terminal 220 is disposed in the negative electrode active material layer 124, and particularly, the negative electrode side metal terminal 220 positioned at this location is referred to as a negative electrode side second metal terminal 222.

As described above, the positive electrode side metal terminal 210 may be at least one of the positive electrode side first metal terminal 211 and the positive electrode side second metal terminal 212, and the negative electrode side metal terminal 220 may be at least one of the negative electrode side first metal terminal 221 and the negative electrode side second metal terminal 222. When the unit cell includes any one of the positive electrode side first metal terminal 211 and the positive electrode side second metal terminal 212 and any one of the negative electrode side first metal terminal 221 and the negative electrode side second metal terminal 222, a desired type of internal short may occur through the metal terminal combination.

As described above, the secondary battery for testing an internal short according to the present disclosure varies in the internal short circuit resistance between the positive electrode current collector 112—the negative electrode current collector 122, the positive electrode current collector 112—the negative electrode active material layer 124, the positive electrode active material layer 114—the negative electrode current collector 122, and the positive electrode active material layer 114—the negative electrode active material layer 124, according to the type and combination of the positive electrode side metal terminal 210 and the negative electrode side metal terminal 220.

As in FIGS. 7A to 7C, in the case of the internal short between the positive electrode current collector 112—the negative electrode current collector 122, the positive electrode current collector 112—the negative electrode active material layer 124, and the positive electrode active material layer 114—the negative electrode current collector 122, after removing a desired shorted area from each electrode current collector 112, 122 coated with the positive electrode active material layer 114 or the negative electrode active material layer 124 to expose the positive electrode current collector 112 or the negative electrode current collector 122, the positive electrode side metal terminal 210 and the negative electrode side metal terminal 220 are provided.

As described hereinabove, after the manufacture of the secondary battery 200 for testing an internal short including the positive electrode side metal terminal 210 and the negative electrode side metal terminal 220, an internal short may occur simply by contact of the other end of each metal terminal 210, 220 in the internal short test.

Figure 8:
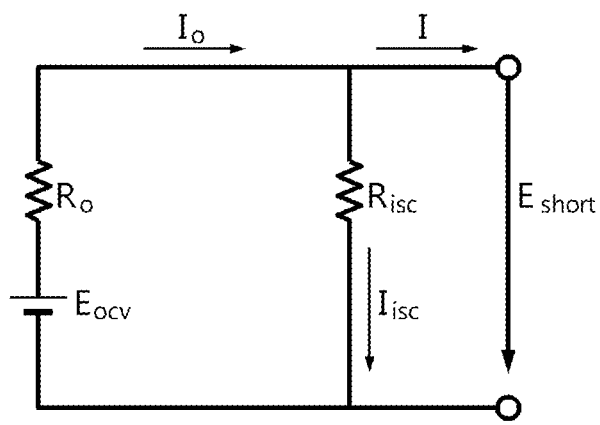
FIG. 8 is a circuit diagram of the secondary battery for testing an internal short of FIG. 5 during an internal short test.

FIG. 8 is a circuit diagram of the secondary battery for testing an internal short of FIG. 5 during an internal short test.

Referring to FIGS. 5 and 8 together, in a stable state before an internal short occurs, the voltage of the secondary battery 200 for testing an internal short will correspond to an open circuit voltage $E_{OCV}$, the internal resistance is $R_0$, and the current is $I_0$. When an internal short occurs by contact between the positive electrode side metal terminal 210 and the negative electrode side metal terminal 220 of the secondary battery 200 for testing an internal short, voltage of $E_{short}$ is applied between the two metal terminals 210, 220 and the current flowing throughout will be I. The short circuit resistance in the secondary battery 200 for testing an internal short when subjected to the internal short is $R_{isc}$ and the short circuit current is $I_{isc}$. When the resistor is connected to the other end of the positive electrode side metal terminal 210 and the other end of the negative electrode side metal terminal 220 and the current flowing across the resistor is measured, it is possible to measure $I_{isc}$ and $R_{isc}$ according to the type of internal short.

Preferably, after the short circuit including the switch and the resistor is connected to the positive electrode side metal terminal 210 and the negative electrode side metal terminal 220 in an off state of the switch, the switch is turned on to cause an internal short of the unit cell 101', and the current flowing the short circuit is measured. In the event of a direct contact between the positive electrode side metal terminal 210 and the negative electrode side metal terminal 220 without switch manipulation, in severe cases, a spark discharge may occur depending on the state of charge of the secondary battery 200 for testing an internal short.

Turning the switch on corresponds to outside mechanical manipulation, not inside, causing a short in the secondary battery 200 for testing an internal short, so it may appear as an external short, but the short is an internal short that is different from an external short. That is, although the method for testing an internal short according to the present disclosure causes a short by manipulation outside of the secondary battery, note that the short is an internal short that is different from an external short.

Simply seeing circuits, an external short and an internal short may be the same, but because the secondary battery includes the positive electrode lead 118 and the negative electrode lead 128 connected to the positive electrode current collector 112 and the negative electrode current collector 122, in the case of the secondary battery including a plurality of unit cells, when forming circuits for all the unit cells, there is a circuit difference between an external short and an internal short.

Figure 9:
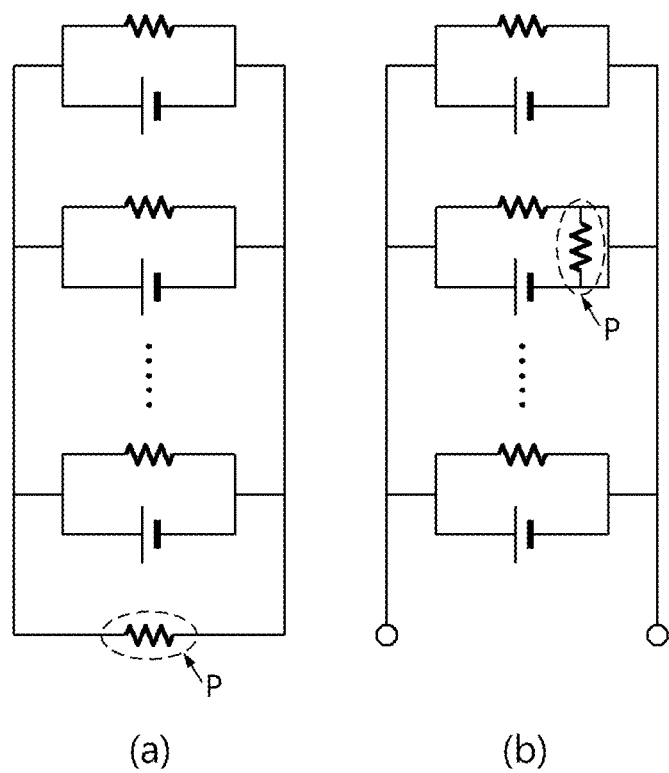
FIG. 9 is a circuit diagram illustrating a comparison between an external short and an internal short.

FIG. 9 is a circuit diagram illustrating a comparison between an external short and an internal short, and their difference is clearly shown in FIG. 9.

(a) of FIG. 9 shows an external short, and (b) shows an internal short, in the case of a plurality of unit cells. In the present disclosure, an internal short occurs by manipulation outside of the secondary battery as shown in (b). In (a) and (b) of FIG. 9, the actual locations of occurrence of the shorts are indicated by the reference symbol P, and they are different from each other. As shown, the internal short in the present disclosure is different from the external short. Additionally, the external short triggers the instantaneous discharge over the entire secondary battery, and it is impossible to simulate a local short in the unit cell like the present disclosure.

Figure 10:
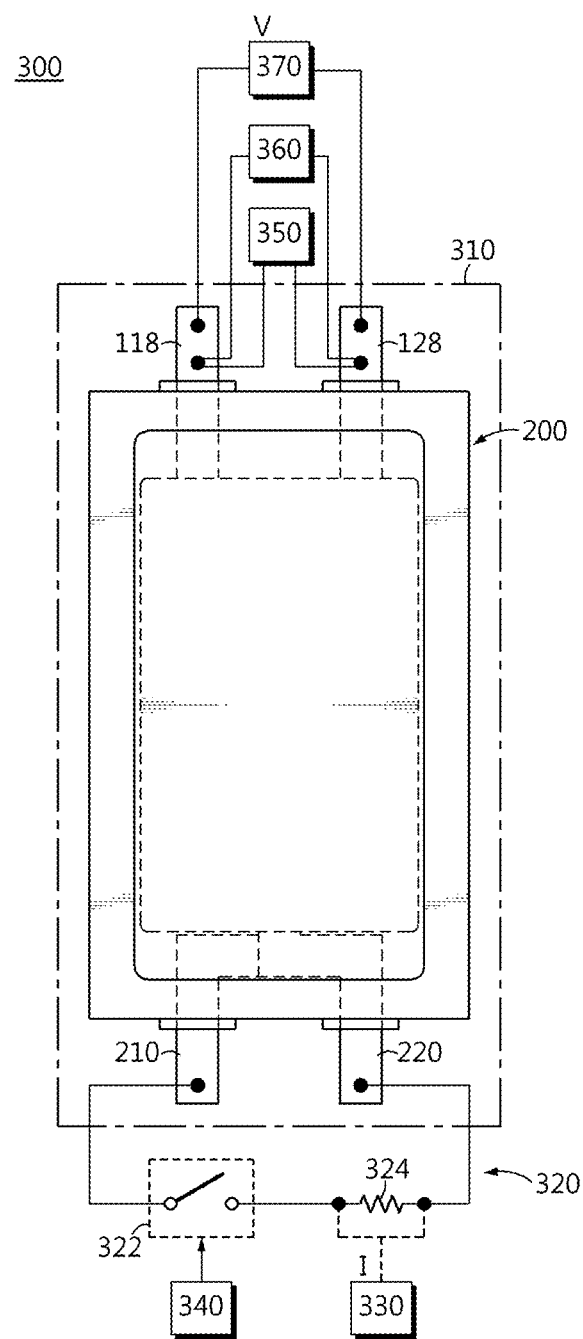
FIG. 10 is diagram of an apparatus for testing an internal short of a secondary battery according to the present disclosure.

FIG. 10 shows an apparatus for testing an internal short of a secondary battery used to perform the method for testing an internal short of a secondary battery according to the present disclosure more properly.

Referring to FIG. 10, the apparatus 300 for testing an internal short of a secondary battery includes an anti-explosion chamber 310, a short circuit 320, a current measuring apparatus 330 and a controller 340. In addition, the apparatus 300 for testing an internal short of a secondary battery may further include an imaging device (not shown) to check the situation of the secondary battery 200 for testing an internal short before and after the internal short.

The anti-explosion chamber 310 loads the secondary battery 200 for testing an internal short in the internal space. The anti-explosion chamber 310 may be a sample chamber with a safety door. The anti-explosion chamber 310 is provided to isolate the inside from the outside, in order to protect the operator and the surroundings in the event of a fire or an explosion in the secondary battery. When the secondary battery explodes or produces toxic gas due to the internal short test of the secondary battery in the anti-explosion chamber 310, the anti-explosion chamber 310 is preferably closed to prevent toxic gas from leaking out. Elements for toxic gas release and purification may be provided. An observation window may be provided for observation of the inner part, or all or part of the anti-explosion chamber 310 may be transparent. Taking into account the foot print of the apparatus 300 for testing an internal short of a secondary battery, the size of the anti-explosion chamber 310 may be designed.

The short circuit 320 is configured to be connected to the positive electrode side metal terminal 210 and the negative electrode side metal terminal 220 of the secondary battery 200 for testing an internal short, and includes a switch 322 and a resistor 324. The switch 322 is used to open and close the short circuit 320, and is configured to open and close in arbitrary timing. Particularly, preferably, the switch may withstand and flow the current flowing during the short circuit test, turn on/off in a stepwise manner when switching from off (open) to on (closed), reduce noise and have good switching characteristics.

The resistor 324 may withstand and flow the current flowing during the short circuit test, and may generally use a shunt resistor. The resistor 324 may be variably set to various values.

The current measuring apparatus 330 measures the current I flowing in the short circuit 320.

The controller 340 controls the on/off of the switch 322. In addition, the switch 322 is off in normal condition, including when connecting the short circuit 320 to the secondary battery 200 for testing an internal short, and the switch 322 may be changed from open to closed or from closed to open by the control of the controller 340 or manual control.

Preferably, the apparatus 300 for testing an internal short of a secondary battery further includes a power source 350 and a load 360. The power source 350 or the load 360 may be connected between the positive electrode lead 118 and the negative electrode lead 128 of the secondary battery 200 for testing an internal short. The apparatus 300 for testing an internal short of a secondary battery may further include a voltage measuring apparatus 370 to measure voltage V between the positive electrode lead 118 and the negative electrode lead 128.

Meanwhile, the apparatus 300 for testing an internal short of a secondary battery may further include an appropriate control unit (not shown) to operate the power source 350, the load 360 and the measuring apparatuses 330, 370 conveniently and effectively, separately or integratedly for each component. For example, the controller 340 may be responsible for all these functions. The controller 340 is generally a computer, and includes software that operates and controls them, and is configured to set and memorize various data values. The apparatus 300 for testing an internal short of a secondary battery may further include a variety of interface devices, for example, a display means such as a monitor, a user input means such as a keyboard. They may be implemented using commercial products, and for example, it is possible to check information associated with the current test situation and test quantity through the monitor, and the measuring apparatuses 330, 370 may transmit the measurement result value to the controller 340 to output the measurement result value to the monitor. The controller 340 may be provided in the form of a meter controller into which the function of the measuring apparatuses 330, 370 is incorporated. In this instance, the meter controller preferably evaluates the state of the secondary battery 200 for testing an internal short during the internal short test, and preferably, may be configured to meter the physical quantity such as current and voltage as well as control the switching of the switch 322. The meter controller is not limited to one device as hardware, and may be a combination of devices. For example, the meter controller may be a general multichannel current/voltage measurement device used in the charge/discharge test of the secondary battery. In this case, the current measuring apparatus 330 may measure through one channel, and the voltage measuring apparatus 370 may measure through other channel.

The method for evaluating an internal short using the apparatus 300 for evaluating an internal short of a secondary battery includes the following exemplary methods, but the present disclosure is not limited thereto.

First Method

The secondary battery 200 for testing an internal short is loaded in the anti-explosion chamber 310.

Subsequently, a contact is simply made between the other end of the positive electrode side metal terminal 210 and the other end of the negative electrode side metal terminal 220 to cause an internal short, and at that time, the state of the secondary battery 200 for testing a short is observed.

Second Method

In another example, the secondary battery 200 for testing an internal short is loaded in the anti-explosion chamber 310, and the short circuit 320 is connected to the other end of the positive electrode side metal terminal 210 and the other end of the negative electrode side metal terminal 220. In this instance, the short circuit 320 is connected to the positive electrode side metal terminal 210 and the negative electrode side metal terminal 220 in an off state of the switch 322. Subsequently, the switch 322 is turned on to cause an internal short in the secondary battery 200 for testing an internal short, and the current flowing in the short circuit 320 is measured by the current measuring apparatus 330.

Third Method

In still another example, the secondary battery 200 for testing an internal short is loaded in the anti-explosion chamber 310, and as mentioned above, the short circuit 320 is connected. Additionally, the voltage measuring apparatus 370 is connected to measure the voltage between the positive electrode lead 118 and the negative electrode lead 128.

When an internal short occurs by turning on the switch 322 of the short circuit 320, voltage (corresponding to full cell voltage commonly measured) between the positive electrode lead 118 and the negative electrode lead 128 is measured by the voltage measuring apparatus 370. The current measuring apparatus 330 measures the current flowing in the short circuit 320.

Fourth Method

In yet another example, the secondary battery 200 for testing an internal short is loaded in the anti-explosion chamber 310, and as mentioned previously, the short circuit 320 is connected. Additionally, the voltage measuring apparatus 370 is connected to measure the voltage between the positive electrode lead 118 and the negative electrode lead 128. The power source 350 or the load 360 is also connected between the positive electrode lead 118 and the negative electrode lead 128.

When the power source 350 is connected, the internal short test may be performed by turning on the switch 322 of the short circuit 320 while charging the secondary battery 200 for testing an internal short. The current flowing in the short circuit 320 is measured by the current measuring apparatus 330, and voltage between the positive electrode lead 118 and the negative electrode lead 128 is measured by the voltage measuring apparatus 370.

When the load 360 is connected, the internal short test may be performed by turning on the switch 322 of the short circuit 320 while discharging the secondary battery 200 for testing an internal short. The current flowing in the short circuit 320 is measured by the current measuring apparatus 330, and voltage between the positive electrode lead 118 and the negative electrode lead 128 is measured by the voltage measuring apparatus 370.

The internal short test checks whether the secondary battery 200 for testing an internal short exploded or fired. After the test, when the secondary battery 200 for testing an internal short is stabilized, it is taken from the anti-explosion chamber 310 and disassembled for analysis of the internal components. When the secondary battery 200 for testing an internal short did not explode or fire, the secondary battery including the positive electrode plate 110, the negative electrode plate 120, the separator 130 and the electrolyte solution of the secondary battery 200 for testing an internal short is determined to be suitable. When a current interrupt means for suppressing the destruction of the battery even though an internal short occurs in the secondary battery 200 for testing an internal short is provided, the current interrupt means is determined to have suitably worked.

On the contrary, when as a result of simulating the internal short, the secondary battery 200 for testing an internal short exploded or fired, the secondary battery including the positive electrode plate 110, the negative electrode plate 120, the separator 130 and the electrolyte solution of the secondary battery 200 for testing an internal short is unsuitable. Additionally, when there is the current interrupt means for suppressing the destruction of the battery, the current interrupt means is determined to be unsuitable. Accordingly, measures are taken to modify the elements of the secondary battery, or change the design condition of the current interrupt means if determined necessary.

Although not described herein, a variety of safety evaluation applications will be possible in stability evaluation item testing at the secondary battery design step or after secondary battery fabrication, and it should be understood that if they use various information acquired by the method for testing an internal short according to the present disclosure, they fall within the scope of the present disclosure.

According to an embodiment, one secondary battery for testing an internal short is configured to test only one type of internal short. For example, the secondary battery 200 for testing an internal short described with reference to FIGS. 4 to 6 is configured to simulate only the internal short $S_D$ between the positive electrode active material layer 114 and the negative electrode active material layer 124. When each secondary battery including each unit cell as shown in FIGS. 7A to 7D is separately manufactured, the secondary batteries will test only each internal short.

Figure 11:
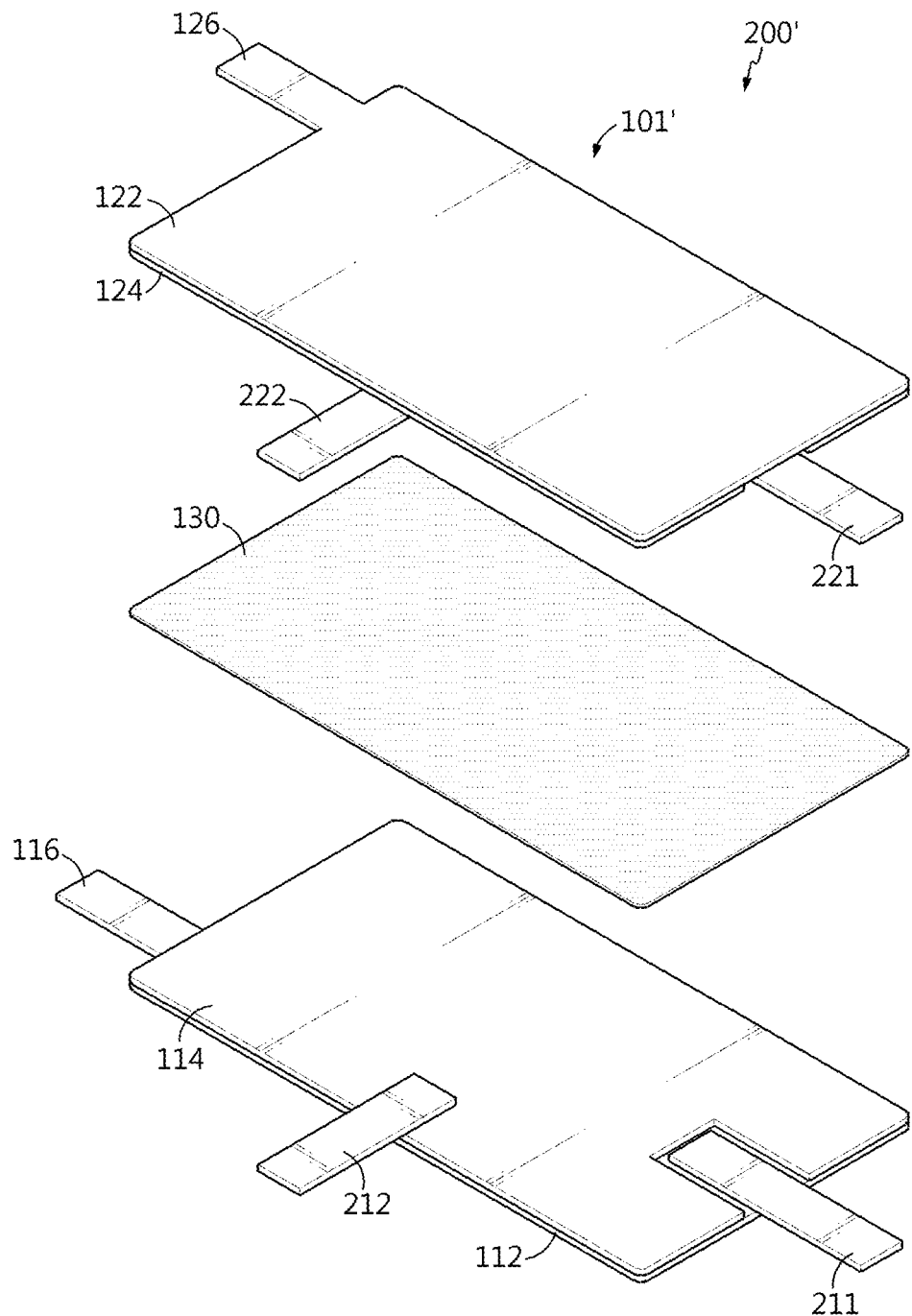
FIG. 11 is an exploded perspective view of a secondary battery for testing an internal short according to another embodiment of the present disclosure.
Figure 12:
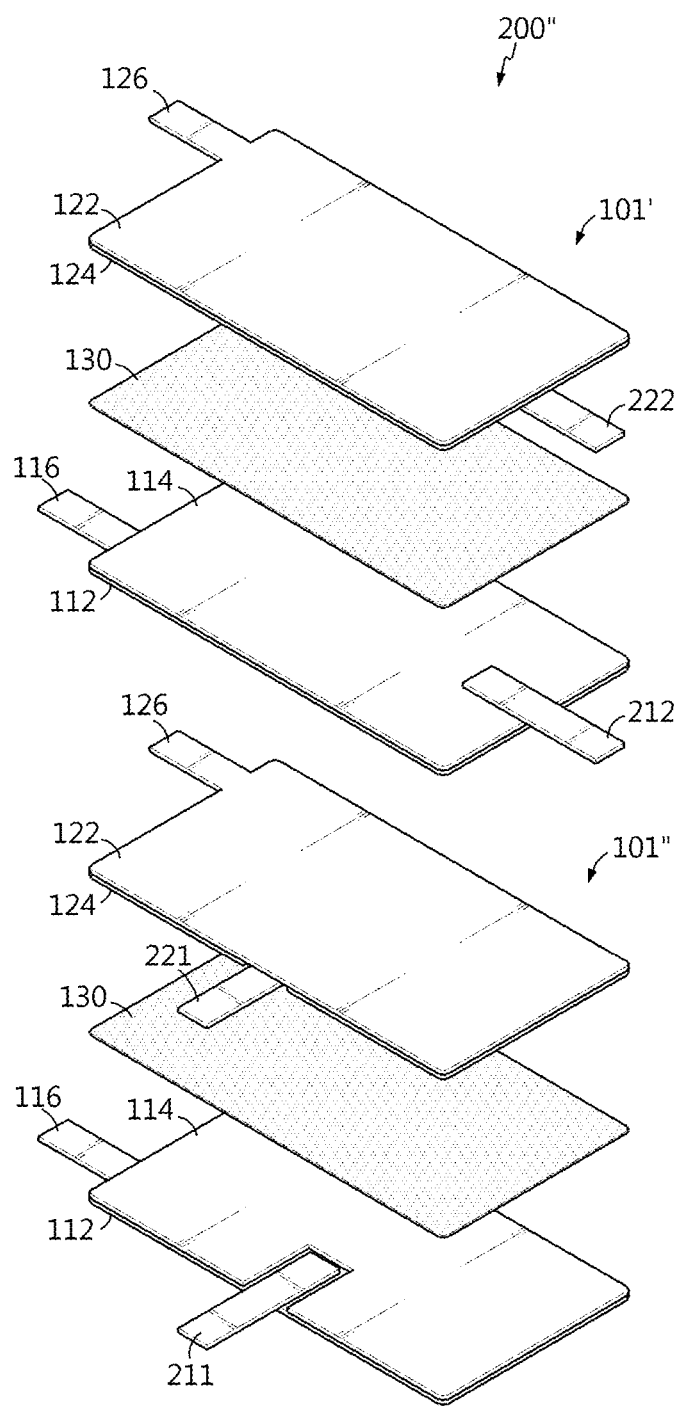
FIG. 12 is an exploded perspective view of a secondary battery for testing an internal short according to still another embodiment of the present disclosure.

According to embodiments, one secondary battery for testing an internal short may be configured to test two or more types of internal shorts. FIG. 11 is an exploded perspective view of a secondary battery for testing an internal short according to another embodiment of the present disclosure, and FIG. 12 is an exploded perspective view of a secondary battery for testing an internal short according to still another embodiment of the present disclosure. Only the unit cell part is shown in FIGS. 11 and 12, and the secondary batteries for testing an internal short may further include a positive electrode lead 118, a negative electrode lead 128, a sealing tape S and a battery case 230 as described with reference to FIG. 5.

For example, as shown in FIG. 11, the secondary battery 200' for testing an internal short includes one unit cell 101' including a positive electrode side first metal terminal 211, a positive electrode side second metal terminal 212, a negative electrode side first metal terminal 221 and a negative electrode side second metal terminal 222. It is possible to cause a desired type of internal short in one secondary battery 200' for testing an internal short through an appropriate combination of the metal terminals. For example, when a contact is made between the other end of the positive electrode side first metal terminal 211 and the other end of the negative electrode side first metal terminal 221, it may be used to simulate the internal short $S_A$ between the positive electrode current collector 112—the negative electrode current collector 122, and when a contact is made between the other end of the positive electrode side first metal terminal 211 and the other end of the negative electrode side second metal terminal 222, it may be used to simulate the internal short $S_B$ between the positive electrode current collector 112—the negative electrode active material layer 124. Likewise, when a contact is made between the other end of the positive electrode side second metal terminal 212 and the other end of the negative electrode side first metal terminal 221, it may simulate the internal short $S_C$ between the positive electrode active material layer 114—the negative electrode current collector 122, and when a contact is made between the other end of the positive electrode side second metal terminal 212 and the other end of the negative electrode side second metal terminal 222, it may simulate the internal short $S_D$ between the positive electrode active material layer 114—the negative electrode active material layer 124.

In addition, as shown in FIG. 12, the secondary battery 200" for testing an internal short includes two types of unit cells 101', 101". An appropriate separator (not shown) may be interposed between the two unit cells 101', 101". As described in FIG. 6, when one unit cell 101' includes the positive electrode side second metal terminal 212 and the negative electrode side second metal terminal 222, and the other unit cell 101" includes the positive electrode side first metal terminal 211 and the negative electrode side first metal terminal 221, it is possible to use the unit cell 101' to simulate the internal short $S_D$ between the positive electrode active material layer 114—the negative electrode active material layer 124 by contact between the other end of the positive electrode side second metal terminal 212 and the other end of the negative electrode side second metal terminal 222, and to use the unit cell 101" to simulate the internal short $S_A$ between the positive electrode current collector 112—the negative electrode current collector 122 by contact between the other end of the positive electrode side first metal terminal 211 and the other end of the negative electrode side first metal terminal 221. Of course, other configuration including an example of metal terminal formation not described herein will be understood from the description of the present disclosure.

When the secondary battery for testing an internal short includes all the positive electrode side first metal terminal 211, the positive electrode side second metal terminal 212, the negative electrode side first metal terminal 221 and the negative electrode side second metal terminal 222, it will be very desirable to form the terminals distinguishably with an eye as described previously, to make it easy to select a desired terminal combination pair.

When comparing the secondary battery 200 for testing an internal short according to the present disclosure with the conventional ISC device 1 shown in FIG. 1, the present disclosure has the following advantages.

There is a difference between the ISC device 1 and the present disclosure where the metal terminals 210, 220 corresponding to the copper disk 10 and the aluminum disk 40 of the ISC device 1 is disposed outside of the secondary battery, and there is no wax layer corresponding to the wax layer 30 of the ISC device 1. In the present disclosure, a metal (a shorting switch metal) that may cause a short has the other end extending out of the secondary battery, and thus it is possible to control an accurate internal short time. In the case of the conventional ISC device 1, an experiment is only possible under the high temperature condition in which the wax layer 30 melts, but the present disclosure has no temperature limitation.

Additionally, in the case of the conventional ISC device 1, once a short occurs, it is difficult to reuse the secondary battery including the ISC device 1, and it is difficult to cause an internal short after cycles. In contrast, according to the present disclosure, after the secondary battery 200 for testing an internal short is manufactured, a short is caused to occur, and thus an internal short test can be performed after intentionally degrading the secondary battery 200 for testing an internal short. According to the present disclosure, it is possible to analyze a safety difference between each unit cell after an internal short occurs in a secondary battery immediately after it is manufactured (a secondary battery including a so-called fresh unit cell) and a secondary battery after cycles (a secondary battery including a degraded unit cell). For example, it is possible to analyze an internal short difference between a unit cell in Birth Of Life (BOL) and a unit cell in End Of Life (EOL), and this is very significant because the ISC device 1 cannot do it.

Figure 2:
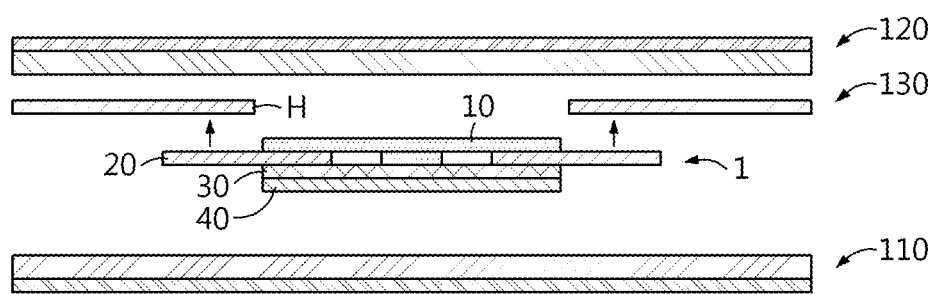
FIG. 2 is a cross-sectional view showing a method of inserting the conventional ISC device into a secondary battery.

As described with reference to FIG. 2, the conventional ISC device 1 is inserted into the hole H formed in the separator 130 of the secondary battery, causing damage to the separator 130. Additionally, in the steps of manufacturing the secondary battery, when assembly is performed in the presence of the ISC device 1, the wax layer 30 melts in the process such as lamination and high temperature aging, and for this reason, disassembly of the manufactured secondary battery is performed prior to insertion. In contrast, the secondary battery 200 for testing an internal short according to the present disclosure prevents damage to the separator 130, and is manufactured by the general secondary battery manufacturing steps only with an addition of the positive electrode side metal terminal 210 and the negative electrode side metal terminal 220. Structure for causing an internal short is implemented in-situ from the secondary battery manufacturing step.

Hereinafter, the present disclosure will be described in more detail through the experimental example of the present disclosure. However, the following experimental example is provided for an easy understanding of the present disclosure, and the present disclosure is not limited to the following experimental example.

Figure 13:
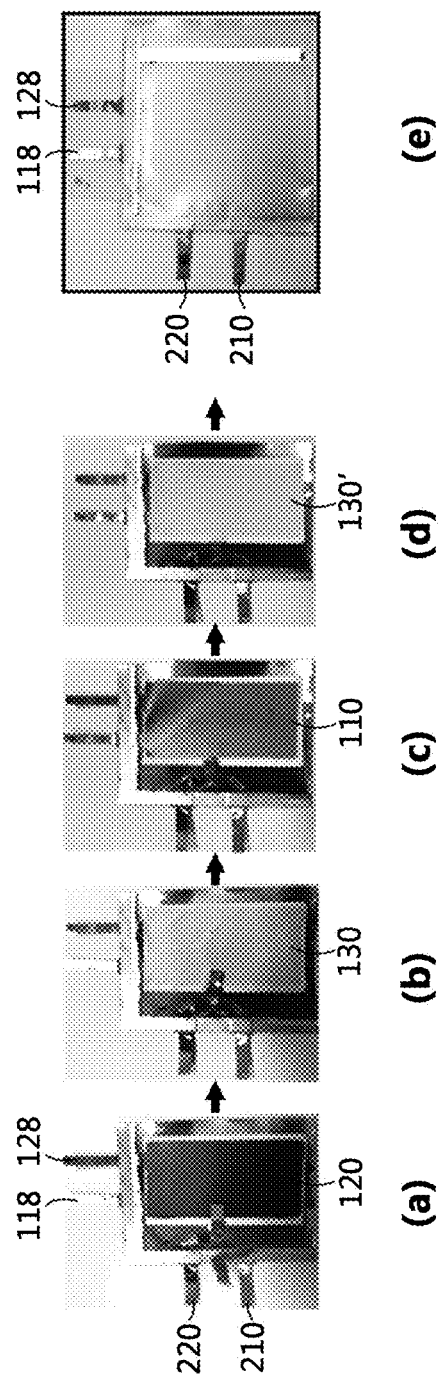
FIG. 13 is a photographic image of a secondary battery for testing an internal short according to an experimental example of the present disclosure.

FIG. 13 is a photographic image of the secondary battery for testing an internal short according to the experimental example of the present disclosure, and (a) to (d) of FIG. 13 show photographic images of the internal part in a reverse order of disassembly of the complete secondary battery for testing an internal short to show the stacking process in each manufacturing process step, and (e) of FIG. 13 is a photographic image of final completion.

Describing the complete state with reference to (e) of FIG. 13 first, the positive electrode lead 118 and the negative electrode lead 128 are exposed on one side of the secondary battery 200 for testing an internal short, and the positive electrode side metal terminal 210 and the negative electrode side metal terminal 220 are exposed on the other side where the positive electrode lead 118 and the negative electrode lead 128 are not formed.

In FIG. 13, (a) shows one end of the negative electrode side metal terminal 220 placed on the negative electrode plate 120. (b) shows one end of the positive electrode side metal terminal 210 placed on the separator 130. One end of each metal terminal 210, 220 is aligned within the secondary battery 200 for testing an internal short. (c) shows the positive electrode plate 110 placed thereon. (d) shows an additional separator 130' included therein. In the photographic image, yellow indicates insulation treatment. The insulation treatment is performed on parts of each metal terminal 210, 220 not in direct contact with each electrode plate 110, 120 within the secondary battery 200 for testing an internal short.

Figure 14:
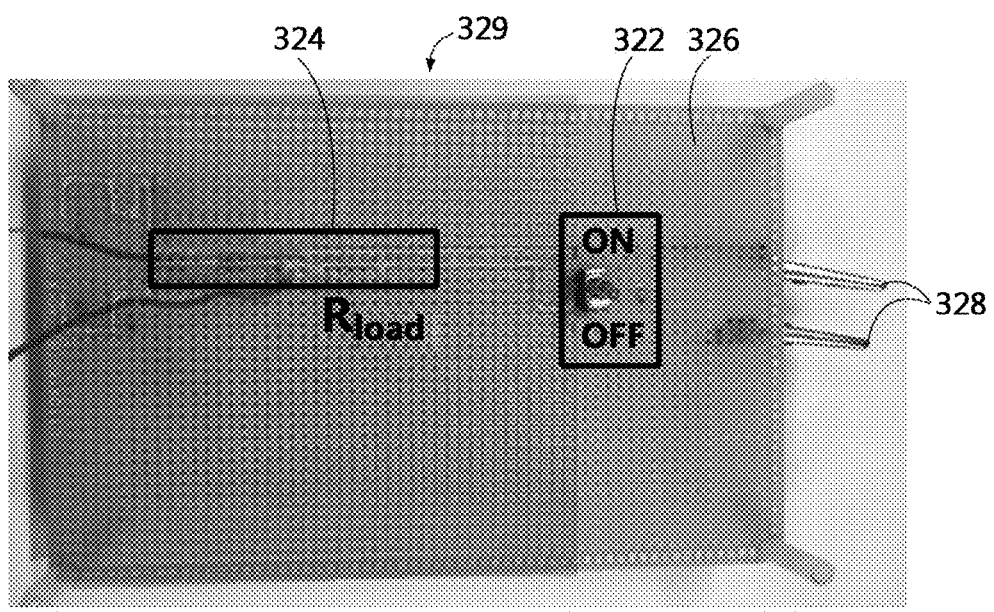
FIG. 14 is a photographic image of a short circuiting device used in an experimental example of the present disclosure.

FIG. 14 is a photographic image of a short circuiting device used in the experimental example of the present disclosure. For simple experiments, the short circuit (320 in FIG. 10) including the switch (322 in FIG. 10) and the resistor (324 in FIG. 10) is implemented in a breadboard 326. As well known, a breadboard is used to make a (generally, temporal) sample of an electronic circuit, and is a reusable solderless device. A general breadboard has strips of an internal connection electrical terminal, known as a bus strip, and the strips are inserted on one or two sides of the breadboard in order to expand the power line like parts of a main device or an isolated block. The breadboard 326 used in the experimental example is a plastic punch block having a spring clip below a hole. Integrated circuits in dual in-line packages (DIPs) are inserted to straddle the centerline of the block. To complete the circuit phase, a pin type resistor $R_{load}$ 324, a pin type switch 322, and an inner connection wire are inserted into the hole of the breadboard 326.

The short circuiting device 329 includes the breadboard 326 having a sensing terminal 328 that is connected to the positive electrode side metal terminal 210 and the negative electrode side metal terminal 220 of the secondary battery 200 for testing an internal short to measure the voltage. It is connected to the secondary battery 200 for testing an internal short to perform an internal short test. The resistor 324 may be changed to 90 mΩ, 50 mΩ, 35 mΩ to adjust the resistance of the short circuit 320 to a desired value. The switch 322 is turned on by manual manipulation to cause a short and is turned off by manual manipulation into open.

Figure 15:
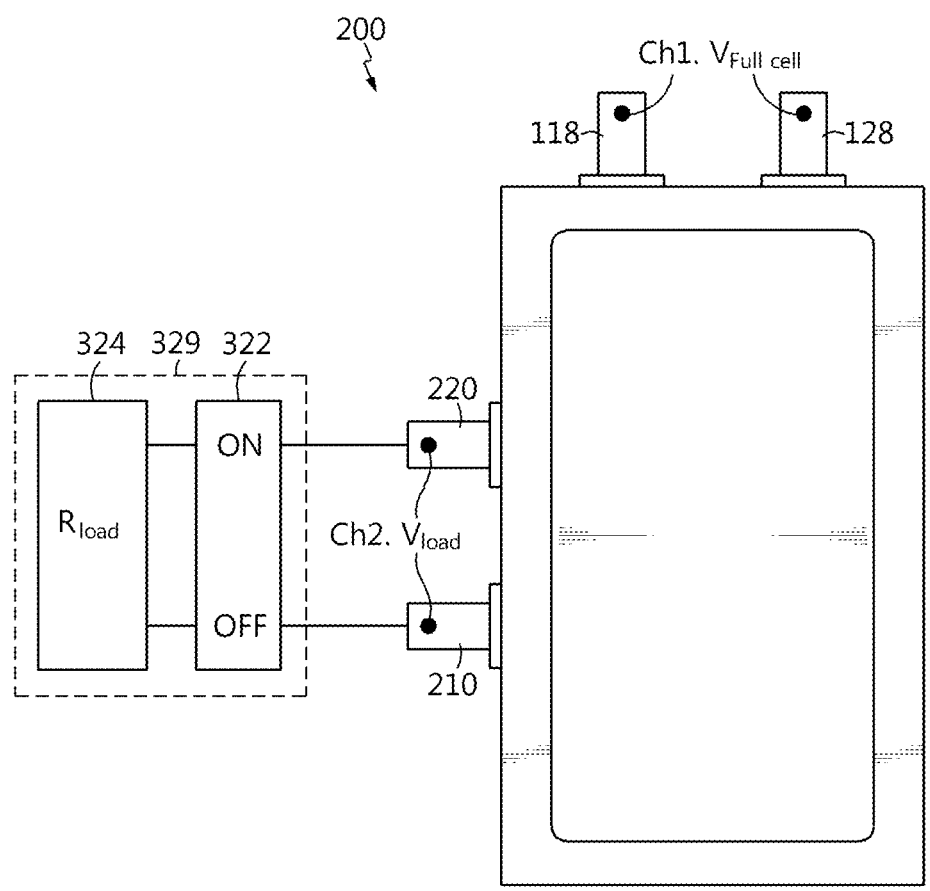
FIG. 15 is a diagram showing connection between a secondary battery for testing an internal short and a short circuiting device according to an experimental example of the present disclosure.

FIG. 15 is a diagram showing connection between the secondary battery for testing an internal short and the short circuiting device according to the experimental example of the present disclosure.

As shown, the short circuiting device 329 is connected to the secondary battery 200 for testing an internal short in an off state of the switch 322. A general multichannel current/voltage measurement device used in the secondary battery charge/discharge test is connected, and voltage (full cell voltage) between the positive electrode lead 118 and the negative electrode lead 128 of the secondary battery 200 for testing an internal short is measured in channel 1 (Ch1. $V_{Full\ cell}$). The voltage between the positive electrode side metal terminal 210 and the negative electrode side metal terminal 220 is measured in channel 2 that is different from channel 1 (Ch2. $V_{load}$).

Figure 16:
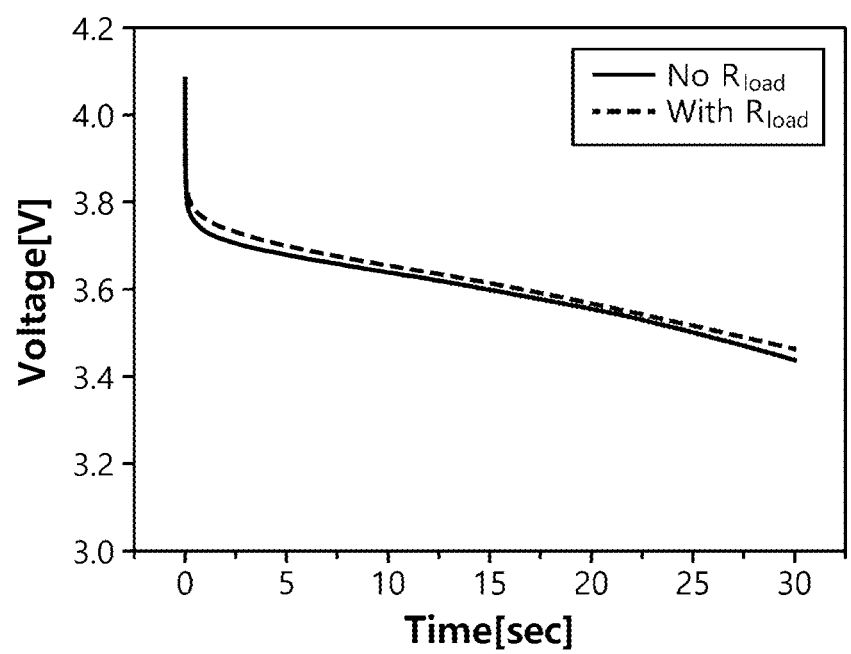
FIG. 16 shows a full cell voltage drop measured by an internal short test in an experimental example of the present disclosure.

FIG. 16 shows a full cell voltage drop measured by the internal short test in the experimental example of the present disclosure.

FIG. 16 shows the full cell voltage measured immediately after the switch 322 is turned on in the connection state as shown in FIG. 15 (With $R_{load}$). For comparison, shown is also the measured value in the absence of the resistor 324 from the short circuiting device 329 (No $R_{load}$). As shown in FIG. 16, a voltage drop is observed over time immediately after a contact is made between the positive electrode side metal terminal 210 and the negative electrode side metal terminal 220 (time 0 sec) by turning on the switch 322. The voltage drop signifies the discharge of the secondary battery 200 for testing an internal short, and this tells the fact that an internal short occurred. It can be seen that it is possible to detect a difference between the presence of the resistor 324 and the absence of the resistor 324. It can be seen from the observed full cell voltage drop that according to the present disclosure, an internal short occurs simply by contact between the positive electrode side metal terminal 210 and the negative electrode side metal terminal 220 outside of the secondary battery 200 for testing an internal short. It can be seen that there is a voltage drop difference between the presence and absence of the resistor 324, and thus it is possible to measure the short circuit current and the short circuit resistance according to the type of internal short, by measuring the current flowing across the resistor 324.

Figure 17:
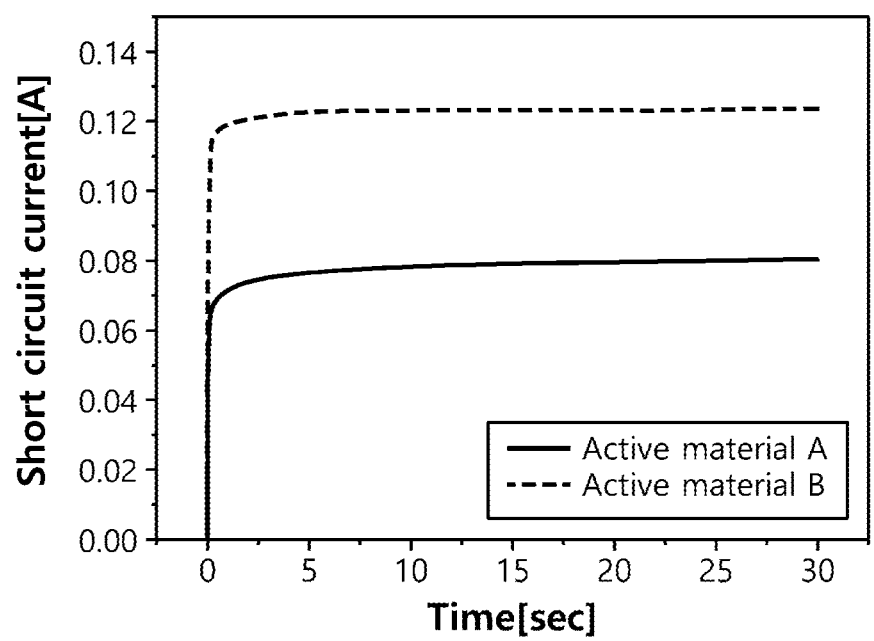
FIG. 17 is a graph showing changes in short circuit current measured by an internal short test performed on two secondary batteries for testing an internal short having different positive electrode active material layers according to an experimental example of the present disclosure.

FIG. 17 is a graph showing changes in short circuit current measured by an internal short test performed on two secondary batteries for testing an internal short having different positive electrode active material layers according to the experimental example of the present disclosure.

To cause an internal short in secondary batteries for testing an internal short having two types of positive electrodes, one secondary battery includes the positive electrode active material layer formed using an active material A and the other secondary battery includes the positive electrode active material layer formed using an active material B that is different from the active material A, and except this difference, the two secondary batteries for testing an internal short are equally manufactured. Subsequently, an internal short test is performed by making a connection as shown in FIG. 15, and the current across the resistor 324 is measured.

As a consequence, referring to FIG. 17, the short circuit current in the secondary battery for testing an internal short using the active material A and the secondary battery for testing an internal short using the active material B is differently measured, and it is possible to acquire information about how different are the short circuit current depending on the type of active material. That is, it can be seen that according to the present disclosure, it is possible to separately measure internal short aspects that are different depending on the type of positive electrode active material layer. As described above, the present disclosure can measure a short circuit current difference caused by an internal short difference resulting from a change in the active material layer, and thus can be used to determine an internal short from the secondary battery design.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

What is claimed is:

1. A secondary battery for testing an internal short, comprising:
   at least one unit cell comprising:
   a positive electrode plate including a positive electrode current collector and a positive electrode active material layer;
   a negative electrode plate including a negative electrode current collector and a negative electrode active material layer; and
   a separator interposed between the positive electrode plate and the negative electrode plate;
   a positive electrode tab formed in the positive electrode plate and a positive electrode lead having one end connected to the positive electrode tab;
   a negative electrode tab formed in the negative electrode plate and a negative electrode lead having one end connected to the negative electrode tab, and
   wherein any one of the at least one unit cell comprises:
   a positive electrode side metal terminal having one end disposed between the positive electrode plate and the separator and an opposite end extending out of the unit cell; and
   a negative electrode side metal terminal having one end disposed between the negative electrode plate and the separator and an opposite end extending out of the unit cell, and
   wherein the secondary battery for testing an internal short is used to cause an internal short in the unit cell by contact between the opposite end of the positive electrode side metal terminal and the opposite end of the negative electrode side metal terminal.

2. The secondary battery for testing an internal short according to claim 1, wherein the secondary battery for testing an internal short further comprises:
   a pouch type battery case which is sealed with the unit cell and an electrolyte solution received therein, and
   wherein an opposite end of the positive electrode lead, the negative electrode lead, the positive electrode side metal terminal and the negative electrode side metal terminal is exposed from the battery case.

3. The secondary battery for testing an internal short according to claim 1, wherein:
   the positive electrode side metal terminal and the negative electrode side metal terminal are visually distinguishable by colors, markings, sizes, or lengths exposed from the unit cell, or
   the positive electrode side metal terminal, the negative electrode side metal terminal, the positive electrode lead and the negative electrode lead are visually distinguishable by colors, markings, sizes, or lengths exposed from the unit cell.

4. The secondary battery for testing an internal short according to claim 1, wherein:
   the positive electrode side metal terminal comprises at least one of a positive electrode side first metal terminal having one end disposed in the positive electrode current collector or a positive electrode side second metal terminal having one end disposed in the positive electrode active material layer, and
   the negative electrode side metal terminal comprises at least one of a negative electrode side first metal terminal having one end disposed in the negative electrode current collector or a negative electrode side second metal terminal having one end disposed in the negative electrode active material layer.

5. The secondary battery for testing an internal short according to claim 4, wherein the secondary battery for testing an internal short comprises a plurality of unit cells, and only one of the unit cells comprises the positive electrode side metal terminal and the negative electrode side metal terminal.

6. The secondary battery for testing an internal short according to claim 4, wherein:
   the secondary battery for testing an internal short comprises a plurality of unit cells, and
   one of the unit cells comprises either one of the positive electrode side first metal terminal or the positive electrode side second metal terminal, and either one of the negative electrode side first metal terminal or the negative electrode side second metal terminal, and
   any one of the remaining unit cells comprises the other positive electrode side first metal terminal or positive electrode side second metal terminal, and the other negative electrode side first metal terminal or negative electrode side second metal terminal.

7. The secondary battery for testing an internal short according to claim 1, wherein:
   one end of the positive electrode side metal terminal and the negative electrode side metal terminal are aligned at a same location in a vertical direction inside of the unit cell, and
   an opposite end of the positive electrode side metal terminal and the negative electrode side metal terminal are spaced apart in a horizontal direction outside of the unit cell.

8. The secondary battery for testing an internal short according to claim 7, wherein the positive electrode side metal terminal and the negative electrode side metal terminal are bent on a plane.

9. An apparatus for testing an internal short of a secondary battery, comprising:
- an anti-explosion chamber which loads the secondary battery for testing an internal short according to claim 1;
- a short circuit configured to be connected to the positive electrode side metal terminal and the negative electrode side metal terminal of the secondary battery for testing an internal short, the short circuit comprising a switch and a resistor;
- a current measuring apparatus which measures a current flowing in the short circuit; and
- a controller which controls on-off of the switch.

10. The apparatus for testing an internal short of a secondary battery according to claim 9, further comprising;
- a power source or a load configured to be connected between the positive electrode lead and the negative electrode lead of the secondary battery for testing an internal short; and
- a voltage measuring apparatus which measures voltage between the positive electrode lead and the negative electrode lead.

11. A method for testing an internal short of a secondary battery, the secondary battery comprising at least one unit cell, the unit cell comprising:
- a positive electrode plate including a positive electrode current collector and a positive electrode active material layer;
- a negative electrode plate including a negative electrode current collector and a negative electrode active material layer; and
- a separator interposed between the positive electrode plate and the negative electrode plate, the method comprising:
  - (a) in any one unit cell, forming a positive electrode side metal terminal having one end disposed between the positive electrode plate and the separator and the other end extending out of the unit cell;
  - (b) in the unit cell having the positive electrode side metal terminal, forming a negative electrode side metal terminal having one end disposed between the negative electrode plate and the separator and the other end extending out of the unit cell; and
  - (c) causing an internal short in the unit cell by contact between the other end of the positive electrode side metal terminal and the other end of the negative electrode side metal terminal.

12. The method for testing an internal short of a secondary battery according to claim 11, wherein the step (c) comprises:
- connecting a short circuit including a switch and a resistor to the positive electrode side metal terminal and the negative electrode side metal terminal in an off state of the switch; and
- turning on the switch to cause an internal short in the unit cell, and measuring a current flowing in the short circuit.

13. The method for testing an internal short of a secondary battery according to claim 12, wherein the secondary battery further comprises:
- a positive electrode tab formed in the positive electrode plate and a positive electrode lead having one end connected to the positive electrode tab;
- a negative electrode tab formed in the negative electrode plate and a negative electrode lead having one end connected to the negative electrode tab; and
- a pouch type battery case which is sealed with the unit cell and an electrolyte solution therein,
- wherein the other end of the positive electrode lead, the negative electrode lead, the positive electrode side metal terminal and the negative electrode side metal terminal is exposed from the battery case, and
- wherein the method further comprises measuring voltage between the positive electrode lead and the negative electrode lead while causing the internal short in the step (c).

14. The method for testing an internal short of a secondary battery according to claim 13, wherein the step (c) is performed while the secondary battery is charged by connecting a power source between the positive electrode lead and the negative electrode lead or while the secondary battery is discharged by connecting a load between the positive electrode lead and the negative electrode lead.

15. The method for testing an internal short of a secondary battery according to claim 11, wherein the positive electrode side metal terminal is at least one of a positive electrode side first metal terminal having one end disposed in the positive electrode current collector and a positive electrode side second metal terminal having one end disposed in the positive electrode active material layer, and the negative electrode side metal terminal is at least one of a negative electrode side first metal terminal having one end disposed in the negative electrode current collector and a negative electrode side second metal terminal having one end disposed in the negative electrode active material layer.

* * * * *